(12) United States Patent
Takimoto et al.

(10) Patent No.: US 9,766,448 B2
(45) Date of Patent: Sep. 19, 2017

(54) MIRROR DRIVE DEVICE

(71) Applicant: HAMAMATSU PHOTONICS K.K., Hamamatsu-shi, Shizuoka (JP)

(72) Inventors: Sadaharu Takimoto, Hamamatsu (JP); Masakuni Kimoto, Hamamatsu (JP); Norihide Adachi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/908,627

(22) PCT Filed: Dec. 12, 2013

(86) PCT No.: PCT/JP2013/083361
§ 371 (c)(1),
(2) Date: Jan. 29, 2016

(87) PCT Pub. No.: WO2015/015665
PCT Pub. Date: Feb. 5, 2015

(65) Prior Publication Data
US 2016/0170200 A1 Jun. 16, 2016

(30) Foreign Application Priority Data

Aug. 1, 2013 (JP) ................................. 2013-160516

(51) Int. Cl.
*G02B 26/08* (2006.01)
*B81B 3/00* (2006.01)
(52) U.S. Cl.
CPC .......... *G02B 26/085* (2013.01); *B81B 3/0021* (2013.01); *B81B 2201/042* (2013.01); *B81B 2207/07* (2013.01)
(58) Field of Classification Search
CPC ...... G02B 26/08; G02B 26/085; G02B 26/10; B81B 3/00; B81B 3/0062; B81B 3/0021;
(Continued)

(56) References Cited

U.S. PATENT DOCUMENTS 7,880,571 B2 * 2/2011 Ko ....................... G02B 26/085
359/224.1
2002/0050744 A1 * 5/2002 Bernstein .............. B81B 3/0062
310/12.03
(Continued)

FOREIGN PATENT DOCUMENTS

JP 2010-169948 A 8/2010
JP 2012-088487 A 5/2012

OTHER PUBLICATIONS

International Preliminary Report on Patentability dated Feb. 11, 2016 for PCT/JP2013/083361.

*Primary Examiner* — Euncha Cherry
(74) *Attorney, Agent, or Firm* — Drinker Biddle & Reath LLP

(57) ABSTRACT

A mirror drive device is provided as one capable of efficiently gaining a driving force. The mirror drive device 1 has a fixed frame 5; a movable portion 7 supported so as to be swingable relative to the fixed frame 5, through torsion bars 10a, 10b extending on an identical straight line, and being of a circular shape; a mirror 9 arranged on a principal surface 7a of the movable portion 7; and a permanent magnet 3 forming a magnetic field around the movable portion 7; the movable portion 7 has a drive coil 12 arranged below the mirror 9; the drive coil 12 is of a 2n-sided polygon shape (where n is an integer of 3 or more) when viewed from a direction orthogonal to the principal surface 7a, at least one side of which is orthogonal to a direction of the magnetic field F.

3 Claims, 9 Drawing Sheets

(58) Field of Classification Search
CPC ........ B81B 2201/038; B81B 2201/042; B81B 2203/051; B81B 2207/07; H04N 1/113
USPC ............................... 359/223.1–226.1, 221.2
See application file for complete search history.

(56) References Cited

U.S. PATENT DOCUMENTS

| | | |
|---|---|---|
| 2008/0238592 A1 | 10/2008 | Ko et al. |
| 2009/0080049 A1 | 3/2009 | Ko et al. |
| 2010/0033278 A1 | 2/2010 | Arnold et al. |

* cited by examiner

Fig.8
(a)
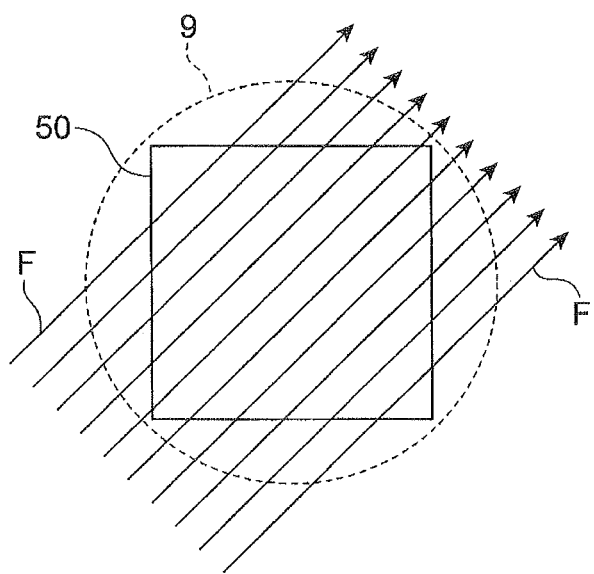
(b)
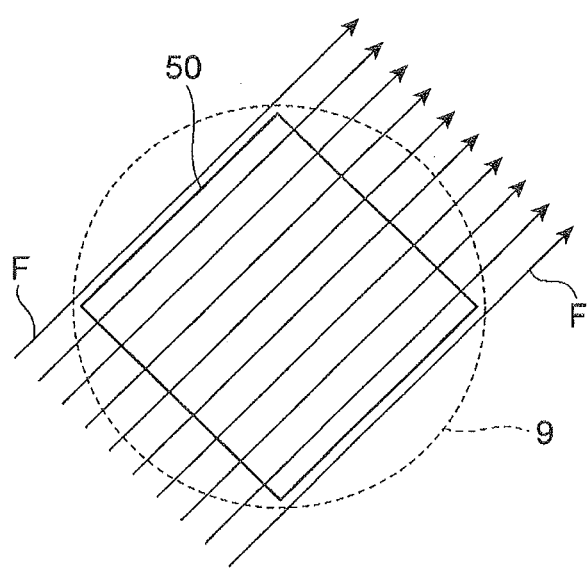

MIRROR DRIVE DEVICE

TECHNICAL FIELD

The present invention relates to a mirror drive device.

BACKGROUND ART

In recent years, active research has been conducted on mirror drive devices by use of the MEMS (Micro Electro Mechanical System) technology (also called micro machine technology) as integration of a mechanical element and an electronic circuit element of microscopic size. An example of the known mirror drive devices is, for example, the one described in Patent Literature 1.

The mirror drive device described in Patent Literature 1 has a mirror portion provided so as to be swingably driven through torsion bars relative to a support portion, and a pair of permanent magnets arranged at positions between which the support portion is located. The mirror portion has a reflecting film formed on its surface and an electromagnetic coil is provided along the shape of the mirror portion between the surface and the reflecting film.

CITATION LIST

Patent Literature

Patent Literature 1: Japanese Unexamined Patent Publication No. 2012-88487

SUMMARY OF INVENTION

Technical Problem

For efficiently gaining a driving force for the mirror portion, it is necessary to reduce the weight of the mirror portion to reduce the moment of inertia. It is generally the case that the shape of a laser beam impinging on the reflecting film of the mirror portion is circular. For this reason, in the case of the structure in which the mirror portion is of a rectangular shape as in the case of the foregoing conventional mirror drive device, there are waste regions (corners) not irradiated with the laser beam. As a result, the mirror portion in the conventional mirror drive device has a large moment of inertia because of its large mass and thus it is hard for the conventional mirror drive device to ensure a satisfactory driving force. Furthermore, since the coil is formed along the shape of the mirror portion (movable plate) in the structure of the conventional mirror drive device, the sides thereof cannot be orthogonal to and many portions thereof cannot intersect with a magnetic field formed by the permanent magnets, depending upon a direction of an electric current flowing through the electromagnetic coil, so as to result in failure in efficiently gaining the driving force.

An object of the present invention is to provide a mirror drive device capable of efficiently gaining the driving force.

Solution to Problem

A mirror drive device according to one aspect of the present invention comprises: a support portion; a movable portion supported so as to be swingable relative to the support portion, through a coupling member and being of a circular shape; a mirror arranged on a principal surface of the movable portion; and a magnet forming a magnetic field around the movable portion, wherein the movable portion has a drive coil arranged below the mirror and arranged at least in part inside the mirror when viewed from a direction orthogonal to the principal surface, and wherein the drive coil is of a 2n-sided polygon shape (where n is an integer of three or more) when viewed from the direction orthogonal to the principal surface, at least one side of which is orthogonal to a direction of the magnetic field.

In this mirror drive device, the movable portion is of the circular shape. This can make the air resistance smaller than in the structure in which the movable portion is of the rectangular shape, and can reduce the moment of inertia because of reduction in weight. In the mirror drive device, the drive coil is of the 2n-sided polygon shape (where n is an integer of three or more) when viewed from the direction orthogonal to the principal surface and at least one side thereof is orthogonal to the direction of the magnetic field. This makes the direction of the magnetic field orthogonal to a direction of an electric current flowing through the drive coil, so that the Lorentz force can be effectively generated. Therefore, the mirror drive device can efficiently gain the driving force.

In one embodiment, the magnetic field is formed along an in-plane direction of the principal surface of the movable portion, and the direction of the magnetic field makes a predetermined angle to a swing axis, when viewed from the direction orthogonal to the principal surface. This makes the directions of the electric current flowing through the drive coil and the magnetic field orthogonal, so that the Lorentz force can be effectively generated. Therefore, the driving force can be efficiently gained.

In one embodiment, the movable portion may have a base material having a groove in which the drive coil is embedded, and the drive coil may be comprised of Cu which is a metal material arranged in the groove. When the drive coil is formed by a damascene process to arrange the metal material in the groove in this manner, flatness can be ensured for the principal surface of the movable portion. When the drive coil is comprised of Cu, the electrical resistivity can be made smaller, and thus a higher electric current can be made to flow through the drive coil. As a result, a greater Lorentz force can be generated, whereby the driving force can be gained more effectively.

Advantageous Effects of Invention

The present invention has enabled the driving force to be efficiently gained.

BRIEF DESCRIPTION OF DRAWINGS

FIG. 8 is a drawing schematically showing relations between drive coil and magnetic field in a comparative example.

DESCRIPTION OF EMBODIMENTS

Embodiments of the present invention will be described below with reference to the drawings but it should be noted that the embodiments below are presented for illustrative purposes to explain the present invention and that the present invention is by no means intended to be limited to the contents described below. In the description, the same elements or elements with the same functionality will be denoted by the same reference signs, without redundant description.

Figure 1:
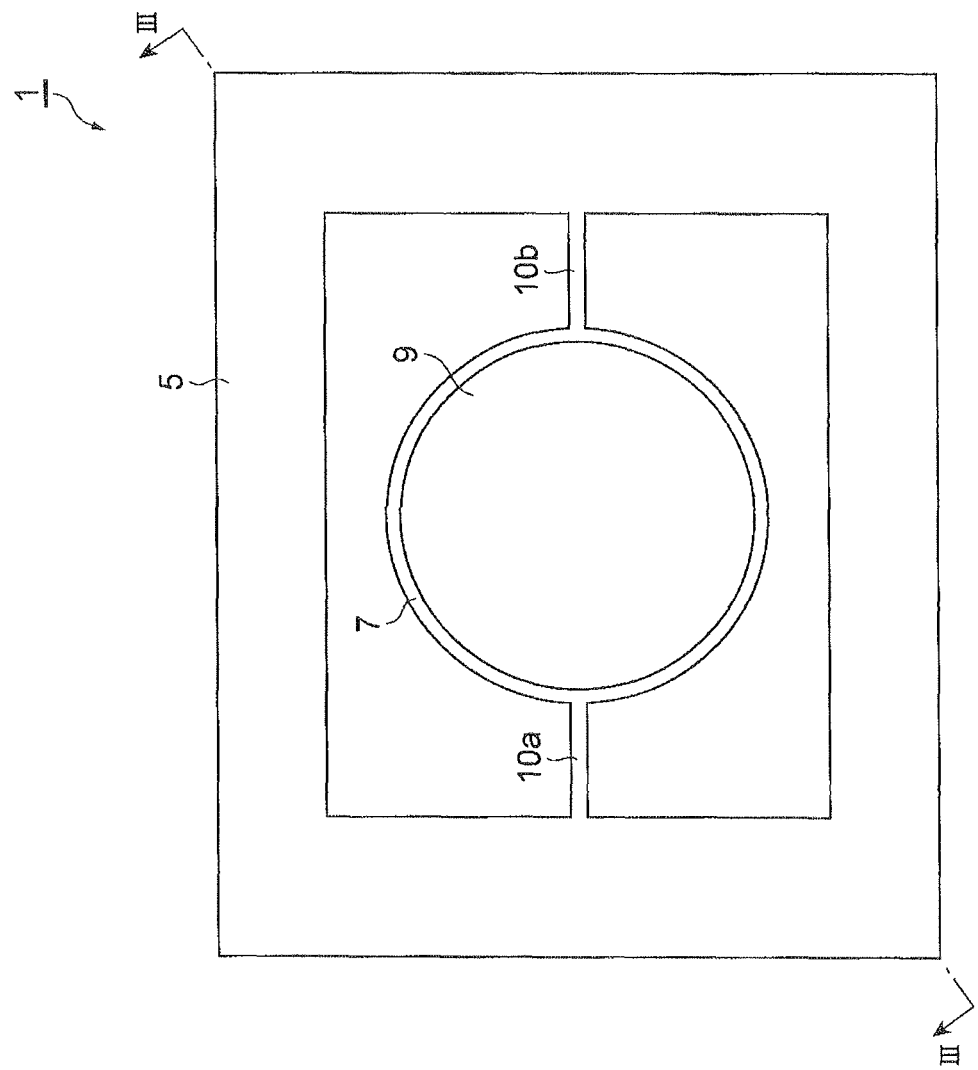
FIG. 1 is a plan view showing a mirror drive device according to one embodiment.
Figure 2:
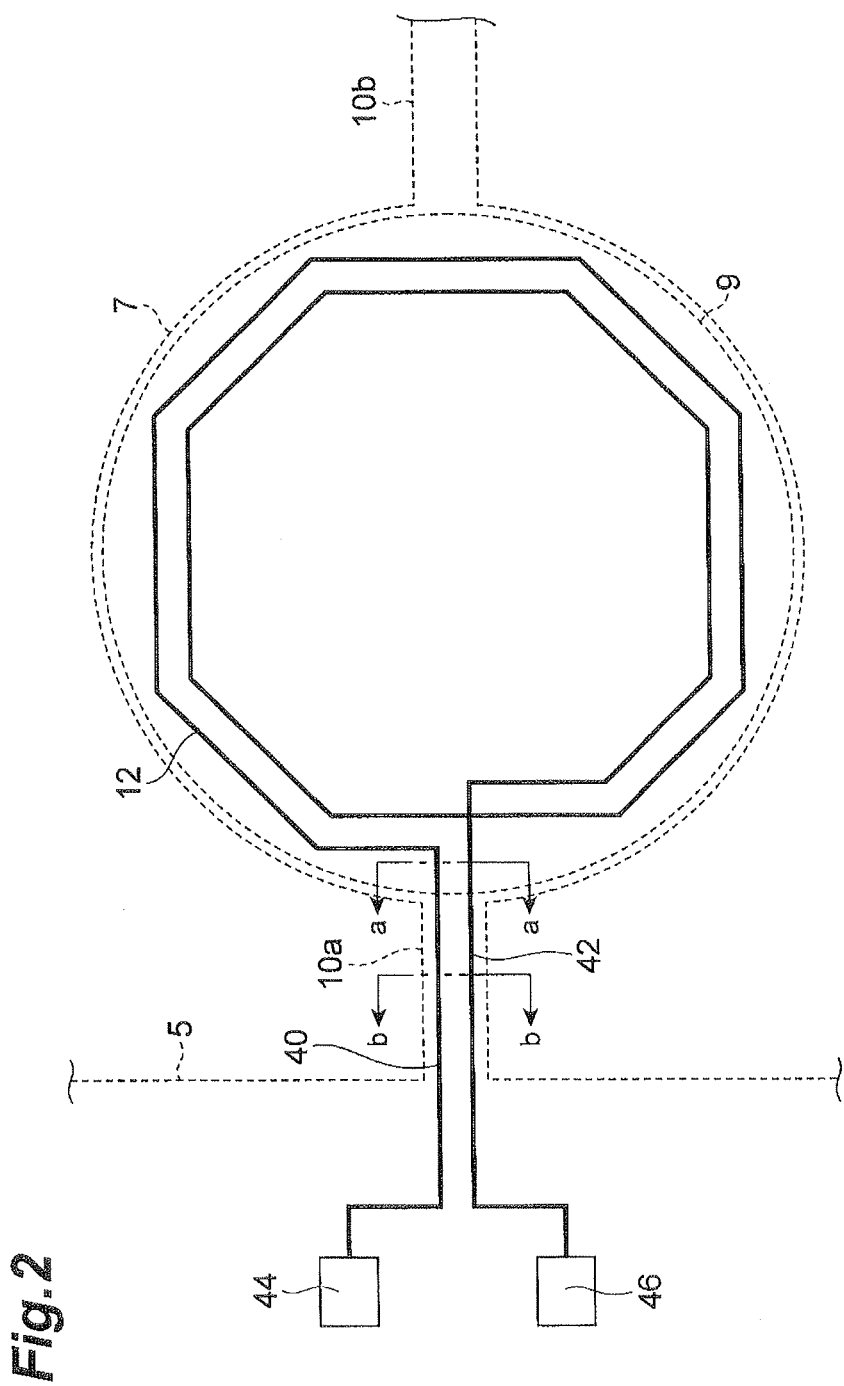
FIG. 2 is a plan view showing a configuration of a drive coil in the mirror drive device shown in FIG. 1.
Figure 3:
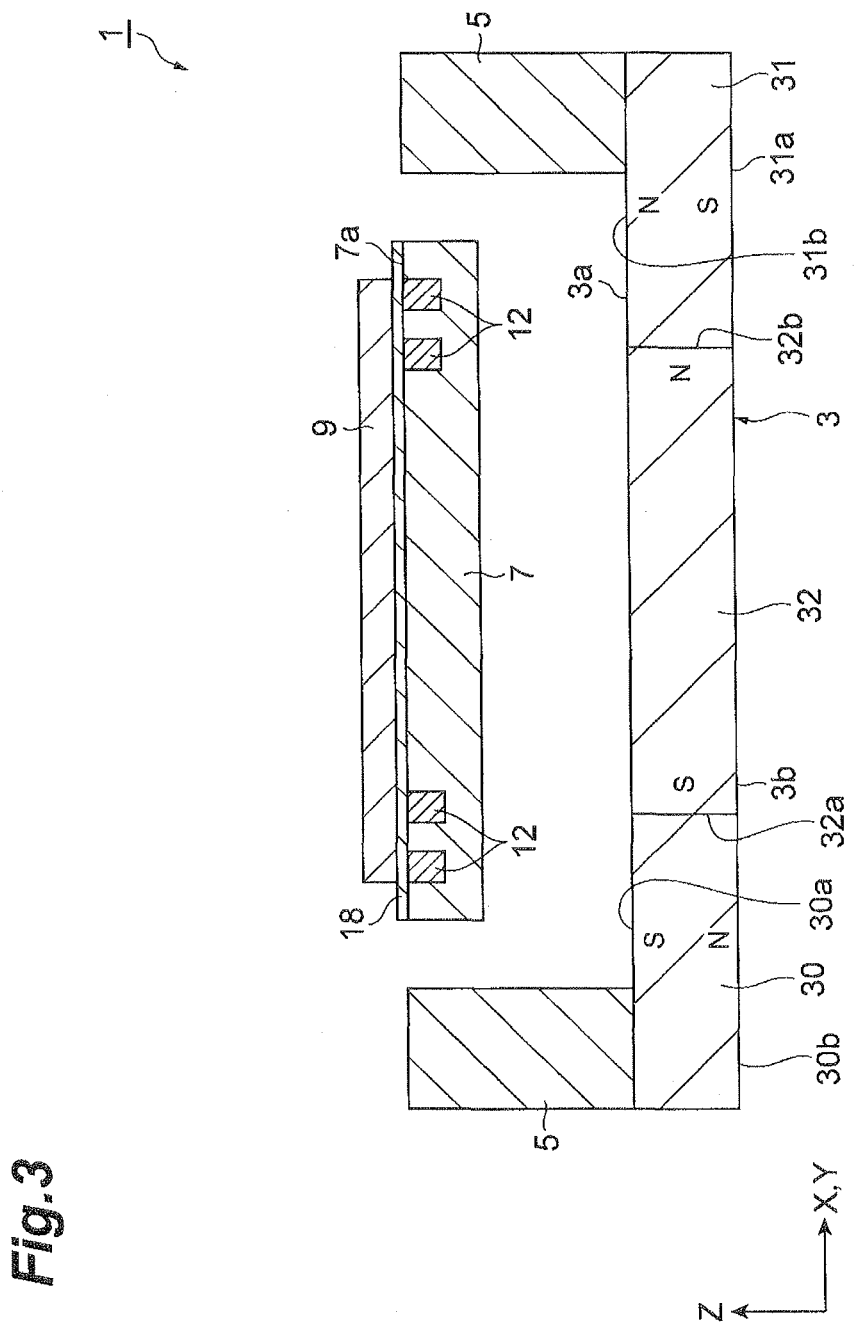
FIG. 3 is a drawing showing a cross-sectional configuration along the line III-III in FIG. 1.

FIG. 1 is a plan view showing a mirror drive device according to one embodiment. FIG. 2 is a plan view showing a configuration of a drive coil in the mirror drive device shown in FIG. 1. FIG. 3 is a drawing showing a cross-sectional configuration along the line III-III in FIG. 1. As shown in each of the figures, the mirror drive device 1 has a permanent magnet 3, a fixed frame (support portion) 5, a movable portion 7, and a mirror 9.

Figure 4:
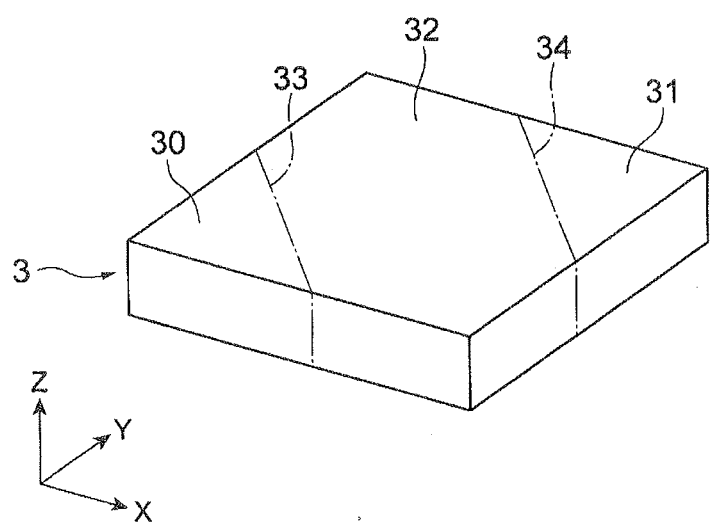
FIG. 4 is a perspective view showing a permanent magnet.

The permanent magnet 3 has a flat plate shape of a rectangular shape. The permanent magnet 3 is arranged below the movable portion 7. The permanent magnet 3 has a pair of principal surfaces 3a, 3b. The permanent magnet 3 forms a magnetic field (magnetic field) around the movable portion 7 (or around a drive coil 12 which will be described later). FIG. 4 is a perspective view showing the permanent magnet. As shown in FIGS. 3 and 4, the permanent magnet 3 has a first magnetic portion 30, a second magnetic portion 31, and a third magnetic portion 32. As shown in FIG. 4, the first magnetic portion 30 and second magnetic portion 31 are arranged on one end side and on the other end side, respectively, in a direction of a diagonal of the bottom surface of the permanent magnet 3, in the permanent magnet 3. The third magnetic portion 32 is arranged between the first magnetic portion 30 and the second magnetic portion 31. A boundary surface 33 between the first magnetic portion 30 and the third magnetic portion 32 and a boundary surface 34 between the third magnetic portion 32 and the second magnetic portion 31 are planes that are parallel to the Z-axis and that intersect with both of the X-axis and the Y-axis.

The first magnetic portion 30 has a magnetic pole 30a of a first polarity and a magnetic pole 30b of a second polarity different from the first polarity. The second magnetic portion 31 has a magnetic pole 31a of the first polarity and a magnetic pole 31b of the second polarity. The third magnetic portion 32 has a magnetic pole 32a of the first polarity and a magnetic pole 32b of the second polarity. The magnetic pole 32a is arranged on the side where it faces the first magnetic portion 30, in the third magnetic portion 32. The magnetic pole 32b is arranged on the side where it faces the second magnetic portion 31, in the third magnetic portion 32. In the present embodiment, the first polarity is the polarity of the S pole and the second polarity the polarity of the N pole. Conversely, the first polarity may be the polarity of the N pole and the second polarity the polarity of the S pole.

The first magnetic portion 30, third magnetic portion 32, and second magnetic portion 31 constitute a Halbach array. Specifically, in the first magnetic portion 30, the magnetic pole 30a of the first polarity and the magnetic pole 30b of the second polarity of the first magnetic portion 30 are opposed in the Z-axis direction. In the third magnetic portion 32 adjoining the first magnetic portion 30, the magnetic pole 32a of the first polarity and the magnetic pole 32b of the second polarity of the third magnetic portion 32 are opposed in a direction parallel to the X- and Y-directions. In the second magnetic portion 31 adjoining the third magnetic portion 32 and located on the opposite side to the first magnetic portion 30 with respect to the third magnetic portion 32, the magnetic pole 31a of the first polarity and the magnetic pole 31b of the second polarity are opposed in the Z-axis direction. As described above, in two adjacent portions out of the first magnetic portion 30, third magnetic portion 32, and second magnetic portion 31, the directions in each of which the two magnetic poles of each portion are opposed are directions normal to each other.

Figure 5:
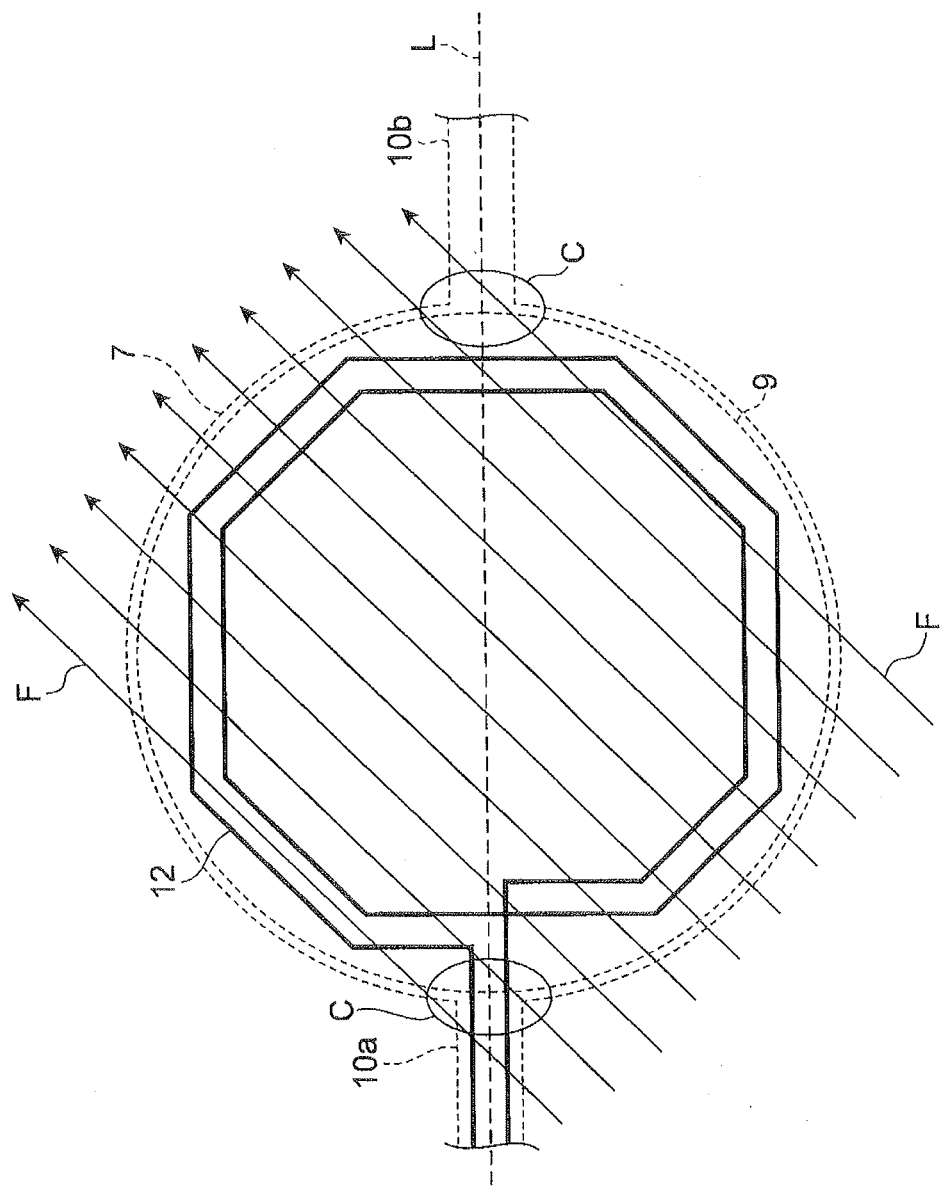
FIG. 5 is a drawing schematically showing a magnetic field.

The direction of the magnetic field formed by the permanent magnet 3 makes a predetermined angle. More specifically, as shown in FIG. 5, the magnetic field F is formed along an in-plane direction of the principal surface 7a of the below-described movable portion 7 and the direction of the magnetic field F makes an angle of about 45° to a straight line L including at least connection points C (or connecting the connection points C) to the movable portion 7 in linear torsion bars (coupling members) 10a, 10b coupling the fixed frame 5 and the movable portion 7. The thickness of the permanent magnet 3 can be set, for example, approximately in the range of 2 mm to 3 mm.

The fixed frame 5 is a frame body of a rectangular shape. The fixed frame 5 is arranged on the principal surface 3a of the permanent magnet 3. The thickness of the fixed frame 5 can be set, for example, approximately in the range of 250 μm to 300 μm.

The movable portion 7 is located in an opening of the fixed frame 5. The movable portion 7 has a flat plate shape of a circular shape. The circular shape stated herein embraces an exact circle and an ellipse. In the present embodiment, the movable portion 7 is of an exact circle shape. The movable portion 7 is supported so as to be swingable relative to the fixed frame 5, through the torsion bars 10a, 10b. The torsion bars 10a, 10b are of a straight line shape and couple the movable portion 7 to the fixed frame 5. The torsion bars 10a, 10b are arranged at positions between which the movable portion 7 is located. In the present embodiment, since the torsion bars 10a, 10b are of the straight line shape, the extending direction of the torsion bars 10a, 10b (or a swing axis (the extending direction of the swing axis)) is identical to the aforementioned straight line L including each of the connection points C between the torsion bars 10a, 10b and the movable portion 7. The torsion bars do not have to be limited only to the configuration of the straight line shape, but the torsion bars may be formed, for example, in a meandering shape having straight parts and turnover parts alternately coupling the two ends of the straight parts. In this configuration, each of the connection points between the torsion bars and the fixed frame 5 and the connection points between the torsion bars and the movable portion 7 may be located on the same straight line or may not be located on the same straight line. When they are not located on the same straight line, the direction to make the predetermined angle with the direction of the magnetic field F is either the extending direction of the torsion bars (coupling members) or the extending direction of the swing axis.

The mirror 9 is arranged on the principal surface 7a of the movable portion 7. In the present embodiment, as shown in FIG. 1, the mirror 9 is of a circular shape. The mirror 9 is a light reflecting film comprised of a metal thin film.

Examples of metal materials to be used for the mirror 9 include aluminum (Al), gold (Au), and silver (Ag).

The drive coil 12 is arranged on the movable portion 7. The drive coil 12 is arranged below the mirror 9 and embedded in the movable portion 7. The drive coil 12, when viewed from a direction orthogonal to the principal surface 7a of the movable portion 7, is arranged inside the mirror 9, i.e., at a position where it is covered (or hidden) by the mirror 9. As shown in FIG. 2, the drive coil 12, when viewed from the direction orthogonal to the principal surface 7a of the movable portion 7, is of a polygonal shape, specifically a 2n-sided polygon shape (where n is an integer of three or more (n≥3)), and in the present embodiment it is of an octagonal shape.

The drive coil 12 has at least one side orthogonal to the direction of the magnetic field. In the present embodiment, the drive coil 12 is of the octagonal shape and, as shown in FIG. 5, two sides of the eight sides are orthogonal to the direction of the magnetic field F and other two sides intersect with the magnetic field F.

Figure 6:
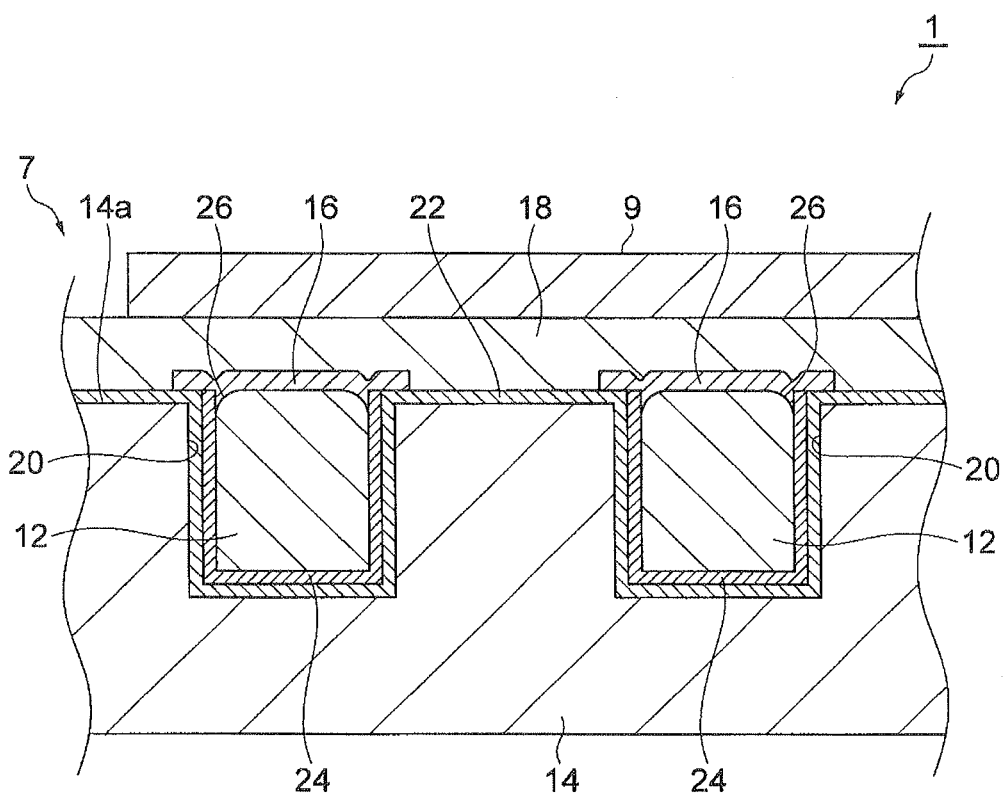
FIG. 6 is a drawing showing a part of a cross-sectional configuration of a movable portion.

Next, the detailed configuration of the drive coil 12 will be described below. FIG. 6 is a drawing showing a cross-sectional configuration of the drive coil in the movable portion. As shown in FIG. 6, the movable portion 7 has a base material 14, the drive coil 12, a covering layer 16, and an insulating layer 18. The base material 14 has a groove 20 of a shape corresponding to the drive coil 12. Namely, the groove 20 is formed in an octagonal shape when viewed from the direction orthogonal to a principal surface 14a (the principal surface 7a). The groove 20 can be formed, for example, by forming a mask in a predetermined pattern on the surface of the base material 14 and then etching the base material 14 through the mask. The base material 14 is comprised, for example, of Si. The thickness of the base material 14 can be set, for example, approximately in the range of 20 µm to 60 µm.

An insulating layer 22 is arranged on the principal surface 14a of the base material 14 and on inner wall faces of the groove 20. The insulating layer 22 is a thermally-oxidized film obtained by thermally oxidizing the base material 14. The insulating layer 22 is comprised, for example, of $SiO_2$. A seed layer 24 is arranged in the groove 20 and on the inner wall faces of the insulating layer 22. Namely, the seed layer 24 is located between the insulating layer 22 and the drive coil 12. The seed layer 24 is obtained by sputtering a dense metal material adhesive to the metal material making up the drive coil 12, onto the base material 14 (insulating layer 22). The metal material making up the seed layer 24 can be, for example, TN.

The metal material making up the drive coil 12 is arranged in the groove 20 and on the seed layer 24. The drive coil 12 is obtained by embedding the metal material on the seed layer 24 by the damascene process. A technique for embedding the metal material in the groove 20 can be plating, sputtering, or CVD.

After the metal material is arranged in the groove 20, the principal surface 14a side may be planarized by chemical mechanical polishing (CMP). In this planarizing step, boundary portions 26 of the drive coil 12 in contact with the seed layer 24 may be locally thinned because of a potential difference or the like made between the drive coil 12 and the seed layer 24. The metal material can be, for example, Cu or Au. The thickness of the drive coil 12 can be set, for example, approximately in the range of 5 µm to 10 µm.

The covering layer 16 extends up onto the principal surface 14a so as to cover the opening of the groove 20. Namely, the covering layer 16, when viewed from the direction orthogonal to the principal surface 14a, covers the entire surface on the principal surface 14a side of the drive coil 12 and also covers the surrounding region of the base material 14 around the groove 20. The covering layer 16 can be obtained, for example, by depositing a metal material over the entire top surface of the base material 14 by sputtering or by CVD and then patterning it.

The metal material making up the covering layer 16 has a function to suppress diffusion of the metal material making up the drive coil 12. The metal material making up the covering layer 16 can be, for example, Al or an alloy containing Al. Examples of the alloy containing Al include an Al—Si alloy, an Al—Cu alloy, and an Al—Si—Cu alloy. A composition ratio of the Al—Si alloy can be, for example, Al 99% and Si 1%. A composition ratio of the Al—Cu alloy can be, for example, Al 99% and Cu 1%. A composition ratio of the Al—Si—Cu alloy can be, for example, Al 98%, Si 1%, and Cu 1%. The thickness of the covering layer 16 can be set, for example, to approximately 1 µm.

The insulating layer 18 is arranged so as to cover the regions over the base material 14 and the covering layer 16. A material making up the insulating layer 18 can be, for example, $SiO_2$, SiN, or TEOS. The mirror 9 is arranged on the insulating layer 18.

As shown in FIG. 2, one end of a lead conductor 40 is electrically connected to one end of the drive coil 12. One end of a lead conductor 42 is electrically connected to the other end of the drive coil 12. The lead conductors 40, 42 extend along the torsion bar 10a to be led out to the fixed frame 5. The other ends of the lead conductors 40, 42 are electrically connected to electrodes 44, 46 arranged on the fixed frame 5. The electrodes 44, 46 are connected to an unshown power supply.

Figure 7:
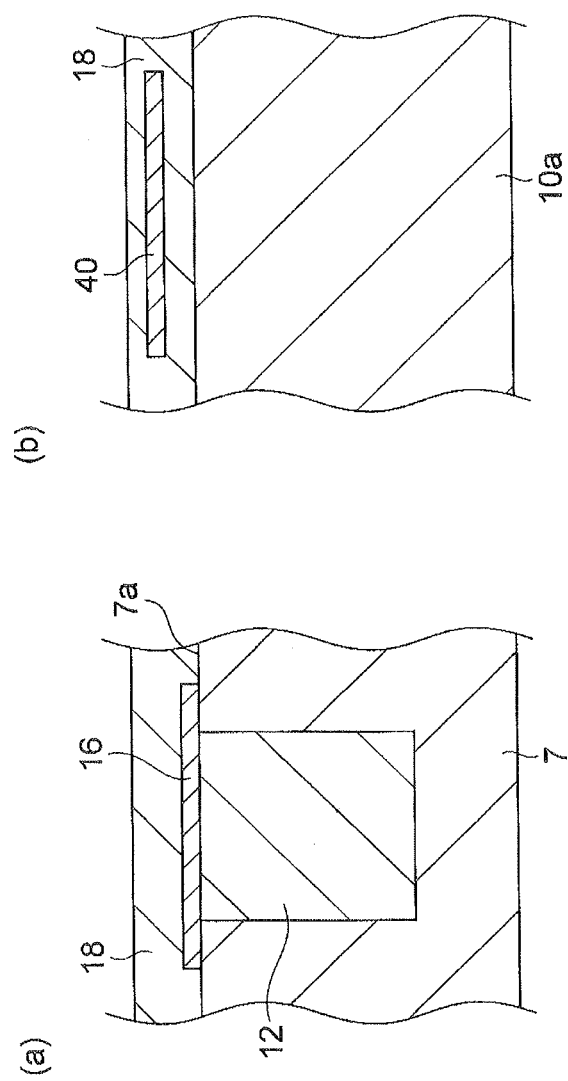
FIG. 7(a) is a drawing showing a cross-sectional configuration along the line a-a in FIG. 2, and FIG. 7(b) a drawing showing a cross-sectional configuration along the line b-b in FIG. 2.

FIG. 7(a) is a drawing showing a cross-sectional configuration along the line a-a in FIG. 2 and FIG. 7(b) a drawing showing a cross-sectional configuration along the line b-b in FIG. 2.

As shown in FIG. 7(a), the drive coil 12 (wiring) is formed of damascene wiring of a material of Cu or Au, near the connection point C between the torsion bar 10a and the movable portion 7. Although not shown, the wiring connecting the lead conductors 40, 42 and the electrodes 44, 46 is formed of damascene wiring, around the connection point between the torsion bar 10a and the fixed frame 5. Near the central region of the torsion bar 10a, as shown in FIG. 7(b), the lead conductor 40 is formed, for example, of a material such as Al or the alloy containing Al, i.e., a material that is more resistant to plastic deformation than Cu forming the drive coil 12. The other end of the drive coil 12 and one end of the lead conductor 40 are electrically connected by an unshown connection portion. As shown in FIGS. 7(a) and (b), the drive coil 12 and lead conductor 40 are located at different heights. For this reason, the drive coil 12 and lead conductor 40 are connected by the foregoing connection portion extending in the direction orthogonal to the principal surface 7a of the movable portion 7. The lead conductor 40 is shown in FIG. 7(b) and the lead conductor 42 also has the same configuration.

In the mirror drive device 1 according to the present embodiment, as described above, the movable portion 7 is of the circular shape. This can make the air resistance smaller than in the structure in which the movable portion 7 is of the rectangular shape, and can also reduce the weight, so as to decrease the moment of inertia. The air resistance in the mirror drive device 1 of the present embodiment is found to be $1.45 \times 10^{-3}$ [N] by simulation, whereas the air resistance in the conventional mirror drive device where the drive coil is arranged around the mirror (movable portion) is $1.70 \times 10^{-3}$ [N]. Therefore, the air resistance at the movable portion 7 can be made smaller in the mirror drive device 1 of the present embodiment.

In the mirror drive device 1, the permanent magnet 3 is arranged below the movable portion 7 and the drive coil 12 is of the octagonal shape when viewed from the direction orthogonal to the principal surface 7a of the movable portion 7. Because of this, the magnetic field F generated in the present embodiment is that making the angle of 45° to the extending direction of the torsion bars 10a, 10b (coupling members) or the extending direction of the swing axis as described above; even in this case, the direction of the magnetic field F is orthogonal to the direction of the electric current flowing through the two sides of the drive coil 12 and the direction of the magnetic field F intersects with the direction of the electric current flowing through other two sides, whereby the Lorentz force can be effectively generated. Therefore, the mirror drive device 1 can efficiently gain the driving force.

FIG. 8 is a drawing schematically showing relations between the drive coil and magnetic field in a comparative example. When the drive coil 50 is of a square shape (in the case where n is smaller than 3 in the 2n-sided polygon shape) as shown in FIG. 8(a), there are no sides orthogonal to the magnetic field F. For this reason, it is difficult for the drive coil 50 of the square shape to produce the Lorentz force and thus the driving force is lowered. In the case of the square shape as in the drive coil 50, the area that can be used below the mirror 9 is small and it is thus hard to secure a sufficient length of the drive coil 50. As a result, the driving force is lowered.

When the sides of the drive coil 50 of the square shape are arranged so as to be orthogonal to the magnetic field F as shown in FIG. 8(b), there are the sides not intersecting with the magnetic field F at all (or the sides parallel to the magnetic field F) in the drive coil 50. The two sides not intersecting with the magnetic field F correspond to half of the length of the drive coil 50 and thus a sufficient driving force cannot be gained even if the other two sides are orthogonal to the magnetic field F. In the configuration shown in FIG. 8(b), the wiring to the torsion bars 10a, 10b needs to be led out from a corner of the drive coil 50. In this case, a load (stress) is likely to focus at the corner and a problem of increase in possibility of disconnection of wiring can also arise.

If the drive coil is formed in the same shape as the mirror 9, i.e., in the circular shape, there are no sides orthogonal to the magnetic field F, so as to fail to gain a sufficient driving force. In the mirror drive device 1 of the present embodiment, the shape of the drive coil 12 is the polygonal shape of the hexagonal or more-sided polygon shape (the octagonal shape). Because of this, in the mirror drive device 1, there are the sides orthogonal to the magnetic field F and there are also the sides intersecting with the magnetic field F though not orthogonal. The sides neither orthogonal to nor intersecting with the magnetic field F are one third of the total length in the case where the drive coil 12 is of the octagonal shape. Furthermore, when the drive coil 12 is of the polygonal shape of the hexagonal or more-sided polygon shape, it is feasible to effectively use the area below the mirror 9, i.e., to effectively secure a sufficient length of the drive coil 12. Therefore, the mirror drive device 1 can efficiently gain the driving force.

Figure 9:
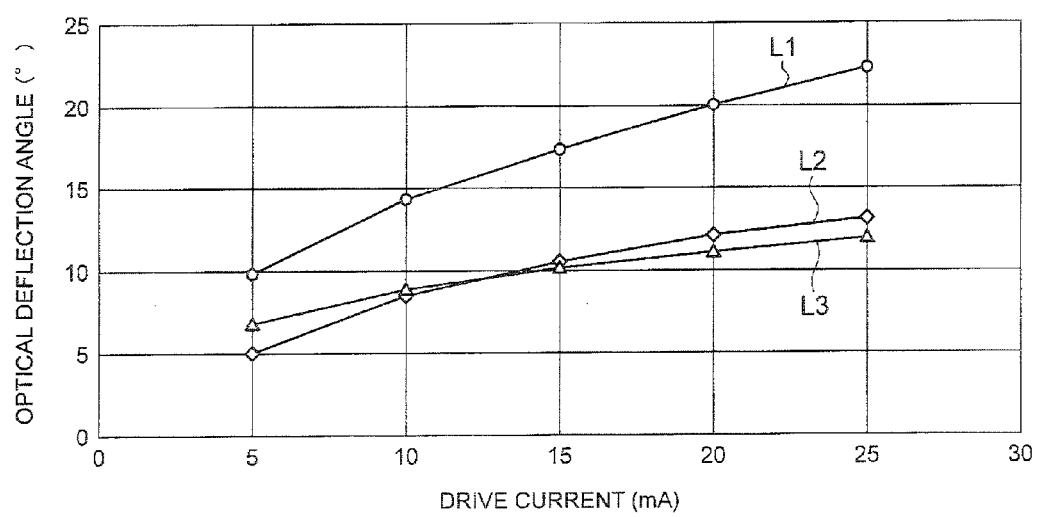
FIG. 9 is a graph showing relations between drive current and optical deflection angle.

FIG. 9 is a graph showing relations between drive current and optical deflection angle. In FIG. 9, the horizontal axis represents the drive current [mA] and the vertical axis the optical deflection angle [°]. In FIG. 9, line L1 indicates the result of the mirror drive device 1 of the present embodiment, and line L2 and line L3 the results of the conventional mirror drive devices. The result shown in FIG. 9 was obtained under the conditions that the number of turns of the drive coil 12 in the mirror drive device 1 of the present embodiment was "3" and the spacing of the drive coil 12 0.6 μm. The conventional mirror drive devices had the configuration wherein the coil was arranged around the mirror (movable portion), the number of turns of the drive coil was "1" (L2) or "3" (L3), and the spacing of the drive coil was 1 μm (L2) or 0.6 μm (L3).

As shown in FIG. 9, the mirror drive device 1 of the present embodiment gains the optical deflection angle approximately twice those of the conventional mirror drive devices. This is attributed to the configuration of the mirror drive device 1 wherein the movable portion 7 is of the circular shape and the drive coil 12 is arranged below the mirror 9, thereby reducing the air resistance and reducing the weight. In this manner, the mirror drive device 1 gains the higher driving force than the conventional configuration.

In the present embodiment, the drive coil 12 is arranged below the mirror 9 and inside the mirror 9 when viewed from the direction orthogonal to the principal surface 7a of the movable portion 7. In the case of the conventional configuration wherein the drive coil is arranged around the mirror, attempts to achieve downsizing must lead to decrease in the area of the mirror. In contrast to it, the mirror drive device 1 can ensure the sufficient area of the mirror 9 and can be downsized because of the aforementioned configuration.

In the present embodiment, the movable portion 7 has the base material 14 having the groove 20 in which the drive coil 12 is embedded, and the drive coil 12 is comprised of Cu which is the metal material arranged in the groove 20. When the drive coil 12 is formed by the damascene process in this manner, flatness of the principal surface 7a of the movable portion 7 can be ensured. When the drive coil 12 is comprised of Cu, the electrical resistivity can be made smaller and a higher electric current can be made to flow through the drive coil 12. As a result, a larger Lorentz force can be generated whereby a larger driving force can be gained.

In the present embodiment, the lead conductors 40, 42 arranged on the torsion bar 10a are comprised of Al or the alloy containing Al. In the torsion bar 10a of the straight line shape, stress is concentrated in its central region. Therefore, the mirror drive device 1 adopts Al or the alloy containing Al, which is more resistant to plastic deformation than the material forming the drive coil 12 (Cu or Au), for the lead conductors 40, 42, which can ensure the strength of the lead conductors 40, 42 in the central region of the torsion bar 10a subject to the stress. In the mirror drive device 1, therefore, the mechanical strength of the torsion bar 10a can be ensured and the lead conductors 40, 42 can be prevented from breaking or the like due to stress concentration.

Concerning the configuration of the lead conductors 40, 42 arranged on the torsion bar 10a and the wiring at the connection points C between the torsion bar 10a and the fixed frame 5 and between the torsion bar 10a and the movable portion 7, another aspect of the present embodiment can be interpreted as a mirror drive device comprising: a support portion; a torsion bar extending on an identical straight line; a movable portion supported so as to be swingable relative to the support portion through the torsion bar; a mirror arranged on the movable portion; a drive electric element (e.g., a drive coil or electrodes of a piezoelectric body) formed on the movable portion; and wiring arranged along an extending direction of the torsion bar on the torsion bar and connected to the drive electric element, wherein the wiring in the vicinity of a connection point between the torsion bar and the support portion and in the vicinity of a connection point between the torsion bar and the movable portion is comprised as damascene wiring of Cu which is a first metal material arranged in a groove, and wherein the wiring in the vicinity of a central region of the torsion bar is comprised of a second metal material more resistant to plastic deformation than the first metal material.

The present invention is not limited only to the above embodiment. For example, the above embodiment was described using the example of the configuration wherein the movable portion 7 was of the exact circle shape, but the movable portion 7 may be of an elliptical shape.

The above embodiment was described using the example of the configuration wherein the mirror 9 was of the circular shape, but the mirror 9 may be of another shape.

The above embodiment was described using the example of the configuration wherein the drive coil 12 was of the octagonal shape, but the drive coil 12 may be of a 2n-sided polygon shape (n≥3) and may be of a hexagonal or the like. In the drive coil 12 of the hexagonal shape, two sides thereof are orthogonal to the magnetic field F and other two sides thereof intersect with the magnetic field F as well.

In the above embodiment the number of turns of the drive coil 12 was 2, but the number of turns of the drive coil 12 may be properly set depending upon design of the mirror drive device 1.

In the above embodiment, the lead conductors 40, 42 of the drive coil 12 were led out via one torsion bar 10a to the electrodes 44, 46, but, for example, the lead conductor 40 may be arranged on the torsion bar 10a and the lead conductor 42 on the torsion bar 10b. Namely, the lead conductors 40, 42 may be configured so that each one is led out via the torsion bar 10a or 10b to the electrode 44 or 46, respectively. In the case of this configuration, when either one of the torsion bars 10a, 10b is broken, either of the lead conductors 40, 42 is disconnected to output no signal and, for this reason, breakage of the torsion bar 10a, 10b can be detected depending upon output of the signal, whereby operation can be suspended. When the lead conductors 40, 42 are arranged on the respective bars, the stress can be further reduced and a short circuit can be prevented between the lead conductors 40, 42.

The above embodiment was described using the example of the torsion bars 10a, 10b of the straight line shape, but the configuration of the torsion bars is not limited only to this but may be the meandering shape as described above or the like.

The above embodiment was described using the example of the configuration wherein the whole drive coil 12 was arranged inside the mirror 9, but the drive coil 12 may be arranged in part inside the mirror 9.

The above embodiment was described using the example of the one-dimensional drive type device in which the fixed frame 5 and the movable portion 7 were coupled through the torsion bars 10a, 10b so as to swing the movable portion 7 around the extending direction of the torsion bars 10a, 10b (coupling members) or the extending direction of the swing axis, thereby one-dimensionally driving the mirror 9, but the mirror drive device may be a two-dimensional drive type device for two-dimensionally driving the mirror 9. In this case, the mirror drive device may be configured with a support portion; a first movable portion supported on the support portion so as to be swingable; a second movable portion supported on the first movable portion so as to be swingable; a mirror arranged on the second movable portion; a first coil arranged on the first movable portion; and a second coil arranged on the second movable portion. The movable portion 7 in the above embodiment corresponds to the second movable portion and the drive coil 12 to the second coil. The first movable portion and the second movable portion are provided so as to be swingable around respective straight lines (axes) orthogonal to each other. In this configuration, the mirror drive device is configured as a two-dimensional drive type device for two-dimensionally driving the mirror 9. The direction of the magnetic field F preferably has predetermined angles to the two swing axes. This eliminates a need for arranging magnets for the respective axes.

REFERENCE SIGNS LIST

1 mirror drive device; 3 permanent magnet; 5 fixed frame (support portion); 7 movable portion; 7a principal surface; 9 mirror; 10a, 10b torsion bars (coupling members); 12 drive coil; 14 base material; 20 groove; C connection points; L straight line.

The invention claimed is:
1. A mirror drive device comprising:
a support portion;
a movable portion supported so as to be swingable relative to the support portion, through a coupling member and being of a circular shape;
a mirror arranged on a principal surface of the movable portion and being of a circular shape that matches the shape of the movable portion; and
a magnet forming a magnetic field around the movable portion,
wherein the movable portion has a drive coil arranged below the mirror and arranged at least in part inside the mirror when viewed from a direction orthogonal to the principal surface, and
wherein the drive coil is of a 2n-sided polygon shape different to the shape of the movable portion (where n is an integer of three or more) when viewed from the direction orthogonal to the principal surface, at least one side of the 2n-sided polygon is orthogonal to a direction of the magnetic field.
2. The mirror drive device according to claim 1,
wherein the magnetic field is formed along an in-plane direction of the principal surface of the movable portion, and
wherein the direction of the magnetic field makes a predetermined angle to a swing axis, when viewed from the direction orthogonal to the principal surface.
3. The mirror drive device according to claim 1,
wherein the movable portion has a base material having a groove in which the drive coil is embedded, and
wherein the drive coil is comprised of Cu which is a metal material arranged in the groove.

* * * * *